(12) United States Patent
Picard et al.

(10) Patent No.: US 6,178,262 B1
(45) Date of Patent: Jan. 23, 2001

(54) CIRCLE LOCATION

(75) Inventors: Len L. Picard, Wilmington; Neil S. Levine, Ashland, both of MA (US)

(73) Assignee: Cognex Corporation, Natrick, MA (US)

( * ) Notice: Under 35 U.S.C. 154(b), the term of this patent shall be extended for 0 days.

(21) Appl. No.: 08/212,173

(22) Filed: Mar. 11, 1994

(51) Int. Cl.⁷ .................................................. G06K 9/00
(52) U.S. Cl. ............................................................ 382/195
(58) Field of Search ................................. 382/141, 147, 382/195, 197, 199, 220, 287

(56) References Cited

U.S. PATENT DOCUMENTS

| | | | |
|---|---|---|---|
| 3,701,095 | * 10/1972 | Yamaguchi et al. | 382/195 |
| 4,493,105 | * 1/1985 | Beall et al. | 382/197 |
| 4,581,762 | * 4/1986 | Lapidus et al. | 382/141 |
| 4,644,583 | * 2/1987 | Watanabe et al. | 382/199 |
| 4,672,676 | * 6/1987 | Linger | 382/287 |
| 4,731,860 | * 3/1988 | Wahl | 382/141 |
| 4,783,829 | * 11/1988 | Miyakawa et al. | 382/199 |
| 4,876,729 | * 10/1989 | Watanabe et al. | 382/199 |
| 4,974,261 | * 11/1990 | Nakahara et al. | 382/141 |
| 5,018,211 | * 5/1991 | Jaffe et al. | 382/147 |
| 5,086,478 | * 2/1992 | Kelly-Mahaffey et al. | 382/287 |
| 5,093,867 | * 3/1992 | Hori et al. | 382/141 |
| 5,127,063 | * 6/1992 | Nishiya et al. | 382/141 |
| 5,251,266 | * 10/1993 | Spigarelli et al. | 382/287 |
| 5,268,999 | * 12/1993 | Yokoyama | 382/141 |
| 5,500,906 | * 3/1996 | Picard et al. | 382/220 |

OTHER PUBLICATIONS

Computer Vision by Ballard & Brown, pub. by Prentice–Hall, Inc., 1982, pp. 65–70.

\* cited by examiner

*Primary Examiner*—Jose L. Couso
(74) *Attorney, Agent, or Firm*—Maureen Stretch; Russ Weinzimmer (57) ABSTRACT

This invention provides an apparatus and method for locating a curvilinear symbol by generating a grey scale model of a segment of a curvilinear symbol and interpolating curvature at the segment's periphery; reflecting this segment around the axes of symmetry to generate a full size model; generating full resolution subfeature models; assigning coordinate axes weighting to each subfeature model x and y axis; defining tolerance thresholds for deviations from an idealized curvilinear symbol; searching a digitized image for shapes corresponding to the subfeature models; assigning weights to scores returned for positions found corresponding to the subfeature models; producing weighted positions combining both coordinate axis weighting and score weighting; computing a best fit for the image found; comparing the positions found to tolerance thresholds and discarding those positions outside the thresholds; substituting and weighting alternate positions found, if any, to compute the location of the curvilinear symbol from remaining positions within the threshold.

14 Claims, 9 Drawing Sheets

250     Pel with circle entry & exit at adjacent sides 230     Pel with circle entry & exit at opposite sides 240

Approximation by Triangle     Approximation by Triangle & Rectangle

FIG. 6

Left Half 290    Right Half 300

$\Delta x = r\cos(\varphi - \theta) - r\cos(\varphi + \theta)$ $\Delta y = r\sin(\varphi + \theta) - r\sin(\varphi - \theta)$

FIG. 9

Score Weighting Function

FIG. 10

Tolerance Checking

CIRCLE LOCATION

BACKGROUND OF THE INVENTION

A. Field of the Invention

This invention relates to machine vision, and more particularly, to methods and apparatus for accurately locating circular or curvilinear patterns in a digitized image.

B. Background

Many production machines require automated alignment of objects such as printed circuit boards before processing operations, such as the insertion of integrated circuits can take place. In such applications, machine vision systems can be used to capture and digitize an image of the object to be aligned and analyze that image for a match to a pre-trained "model" of a fiducial or locator target on the object. Typically, search techniques such as correlation search, contour finding or edge detection are used to locate x,y coordinates in the digitized image for a possible match to the pre-trained model. Those results are then sent to the production machine equipment, where the information can be used to move the printed circuit board for proper alignment.

One technique used to improve accuracy in such searching is to decompose the features of the fiducial or target pattern into subfeatures, such as corners or arcs that can be independently located more accurately and whose locations can then be combined to give the location of the whole. The creation of subfeatures is usually done in a separate training step, while searches are conducted at runtime, during production.

Subfeature models of angular fiducial symbols, such as squares, rectangles, crosses and triangles, can be generated using a number of techniques that are simple, fast and accurate. Models of circular or curvilinear fiducials can also be created using existing techniques. However, for reasons of computational efficiency in existing systems and because fiducials are frequently uniform in grey level, the model for a circle or curvilinear symbol is typically a binary model generated from a synthetic image. Calculating grey level values for the boundary locations of a curvilinear object is a more complex task than it is for angular objects.

Previous circle location schemes train four subfeature models at 0, 90, 180, and 270 degrees. Prior techniques can vary in accuracy. If multiple images are taken of the same fiducial (without moving it under the camera), the resulting location reported by the fiducial finder can vary from image to image by as much as 0.25 to 0.5 pixels or pels. Even though this variation is not very severe, it is too great for applications that demand highly accurate position information.

One cause of inaccuracy stems from the binary nature of the typical circular or curvilinear fiducial model. Since curvilinear fiducials cannot be exactly represented by an integral number of binary pels, inaccuracies are built into the model. Computations necessary to determine the fill of a synthetic grey scale circle model are also not trivial. One such method involves the use of integration.

Furthermore, the presence of confusing artifacts near or around the object of interest, non-uniform lighting variations, scale variations, video noise generated in the imaging system, and smearing or obscuration of parts of the symbol all contribute to the difficulty of locating a symbol accurately.

Another significant problem in using subfeature models for curvilinear objects stems from the fact that the x and y axis coordinate positions returned for a particular subfeature model may not be equally likely to indicate a good match. For example, a subfeature model centered at the zero degrees location on the circle's periphery provides quite accurate information about the x axis location of the symbol, but the y axis information is not definitive for that point on the circumference, due to the slow curvature of the circle perimeter. For each subfeature model around the circumference, the x, and y coordinates may vary in their respective information value in a search.

Similarly, in existing search techniques using templates or models, it may happen that the results that match the subfeature model most closely may in fact be positions found as a result of spurious artifacts in the image. For example, a circular fiducial may be represented by four subfeature models. If these four subfeature models are used to search for the fiducial, three of the resulting positions found in the image may actually be part of the fiducial. However, an artifact which is not part of the fiducial may be located by the search technique as a best match for the fourth subfeature. This artifact may be positioned so far away from the other three it could not possibly be part of the fiducial.

SUMMARY OF THE INVENTION

The present invention provides an apparatus and method for locating curvilinear symbols in digitized images. The invention generates a grey scale synthetic model of a symmetrically located segment of a curvilinear symbol or object, assigns foreground pixel values to those pixels located entirely within the segment; assigns background pixel values to those pixels located entirely outside the segment; and approximates pel values for boundary pixels of the segment by interpolation. The invention creates a full size grey scale full resolution model of the symbol by reflecting the segment about the axes of symmetry of the symbol. Full resolution subfeature models are created from the full size image.

Next, x and y axes coordinate weighting factors are computed for each subfeature model. These values are applied to assign a confidence level to each x and each y axis in each subfeature model. When locations corresponding to the subfeature models are found by the machine vision system, location of the symbol is computed by combining the weighted x,y coordinates in the digitized image which correspond to each subfeature model. Another aspect of the invention also assigns a weighting based on the search scores returned by the search function of the vision system used and incorporates this in the computation of the position of the object. A preferred embodiment combines both weighting methods.

The invention further provides for setting tolerance thresholds for deviation in distance from an ideal or expected or anticipated subfeature model location, based upon the position returned by a full model coarse search. The invention computes the location of the symbol using the x,y coordinates returned by the machine vision system for each weighted subfeature model after discarding distances for shapes outside the tolerance threshold.

In a preferred embodiment of the invention, the machine vision search function is asked to return a specified multiple of possible matches for each subfeature model. A weighted best fit computation is first done for the set of points found that have the best scores. Least squares error regression techniques can be used to compute a best fit for circles and other curvilinear shapes to which such best fit techniques apply. If a fit is found, the present invention next checks the positions for conformance to the tolerance thresholds. If all positions found are within tolerance, the location of the object is computed and passed to the host controller. If a position is not within tolerance, the next result for that subfeature model is selected, weighted, and subjected to best fit analysis, until a sufficient number of positions have been found within tolerance.

It is an object of this invention to use grey level synthetic models or pre-trained images to represent pixels or pels on the edge of an imaged object, rather than simply rounding up or down to an appropriate binary level to represent the edge pixels. Generating a grey level subfeature model of edge pels or selecting pre-trained grey level subfeature models enables the present invention to achieve more reliable symbol and object location.

It is a further object of this invention to reduce the time and steps needed in the generation or training of models for use in searching for circles or other curvilinear objects.

It is an aspect of the invention that using rectangles and triangles to interpolate the area of boundary pixel values is simpler and faster than computing the area of an arc of a circle or other curvilinear symbol. Other interpolation or approximation techniques, such as two-dimensional linear interpolation, and piece wise linear interpolation can be used.

It is yet another aspect of this invention that assigning weighting factors to the x, and y axes of subfeature models of curvilinear objects increases the likelihood that subfeature models will contribute usefully and accurately to the final result. Another aspect of the present invention is that the weighting factors assigned to axes coordinates are smooth, in that they do not produce large discontinuities, are related to the information content in the x and y dimensions, and are capable of being computed at the time the models are being trained and applied at runtime. This reduces processing steps and time during actual production runs.

In a preferred embodiment of the invention, where thresholds are established for tolerances, a search is asked to return a specified number of multiple results for each subfeature model.

It is an aspect of the present invention that it improves the accuracy of location of a curvilinear object to within 0.05 of a pixel. This is five to ten times more accurate than previous techniques.

DETAILED DESCRIPTION OF THE INVENTION

Figure 1:
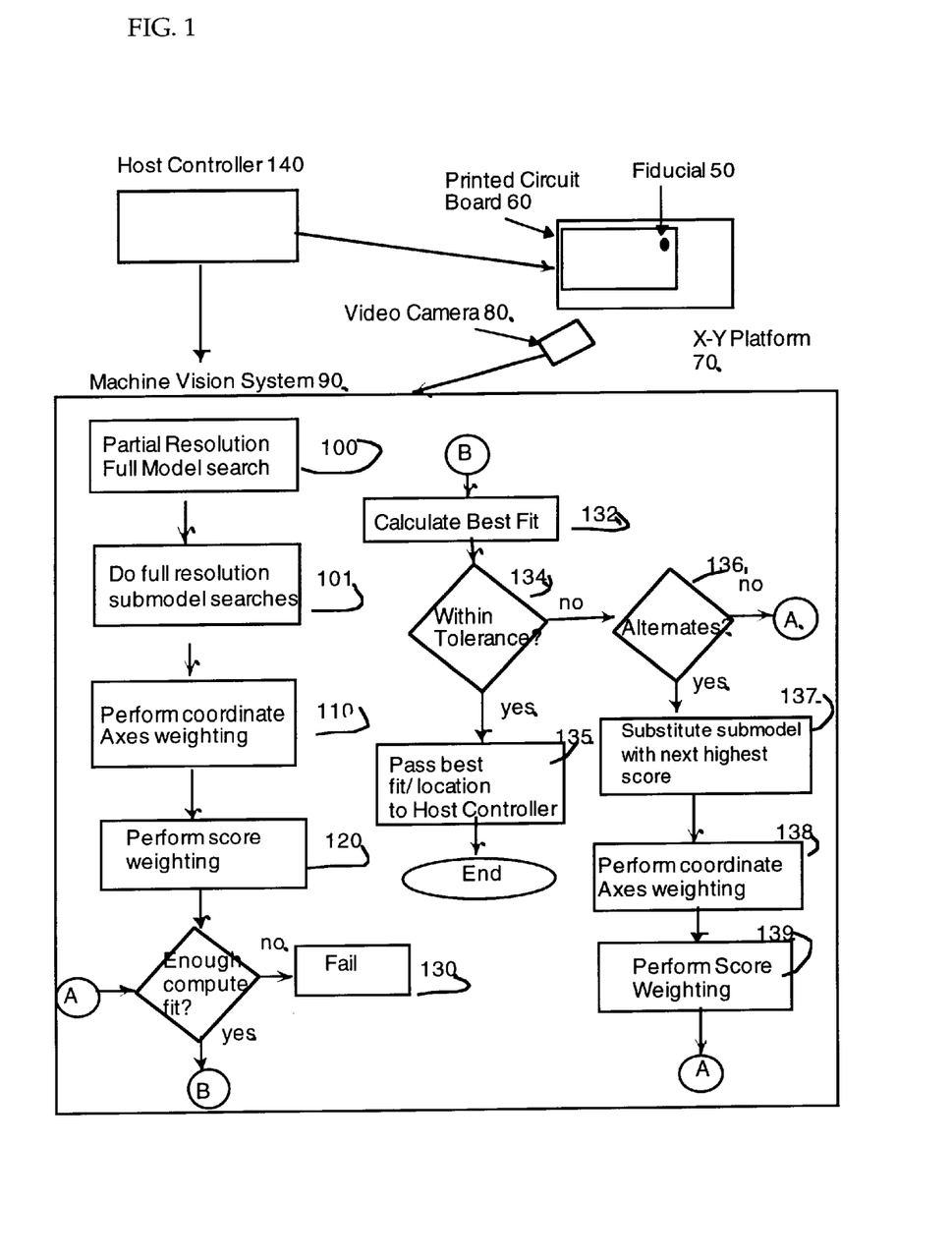
FIG. 1 is a schematic block diagram of the method and apparatus of the present invention connected to a host controller, and a video camera.

With reference now to FIG. 1, the present invention provides a method and apparatus for locating a circular or other curvilinear fiducial symbol 50, in a digitized image of an optically sensed object. As can be seen in FIG. 1, an object, such as a printed circuit board 60, is placed on an x,y platform 70. A video camera 80, attached to a machine vision system 90, is positioned so as to capture an image of the printed circuit board 60, on the x,y platform 70, and transmit the image to the machine vision system 90.

The machine vision system 90 creates a digital representation of the image. In a preferred embodiment of the present invention, a partial resolution full sized model search 100 is done to find the region of interest likely to contain the fiducial. The present invention selects full resolution subfeature models corresponding to fiducial 50 which have been previously generated in a training step. Using the subfeature models, the invention searches the image at step 101. The x,y coordinates which correspond to each submodel are weighted, in step 110, according to the axis weighting methods and apparatus of the present invention and any scores returned by the machine vision system from the search are also weighted in step 120.

At decision point A, a determination is made whether enough points have been found to compute the location of the fiducial 50 in the image. If fewer than a sufficient minimum have been found, the search has failed and is terminated for this image 130. If a sufficient number of points have been found to locate the type of object being sought, the system proceeds to point B, to calculate the best fit 132. Least squares error best circle fitting techniques can be used here, or a technique described below can also be used.

Once a fit has been determined the location has been tentatively computed. The points corresponding to each subfeature model are then checked by the system to see if they are within tolerance thresholds specified by the user, at determination point 134. If they are within tolerance, the location of the best fit calculated at step 132, or a location arrived at by any fitting technique used is passed to the Host Controller 140 in step 135, for appropriate alignment or other action.

If one or more points corresponding to the subfeature models are not within tolerance thresholds, the system next determines whether alternate positions exist at determination point 136. In a preferred embodiment of the present invention, the search functions of the machine vision system can return multiple results for each model or submodel, if requested to do so. All the results for a submodel are scored by the search function to indicate the degree of similarity between the shape found and the submodel. In the interests of accuracy, multiple results are requested in one preferred embodiment. This may not always be desirable, however, since multiple results require some additional processing time at runtime, and hence, may be dispensed with for some applications.

In the situation in which one or more positions failed the tolerance check, if alternate locations have been requested and found, the system, at step 137 selects the submodel position alternate with the highest score and substitutes it for the points that failed to pass the tolerance thresholds.

Using these new positions, the system performs coordinate axes weighting 138 and score weighting 139 and returns to determination point A. The determinations continue until the fiducial is found, or a failing condition is reached. If the fiducial is not found, this fact is also relayed to Host Controller 140, for appropriate action.

Figure 2:
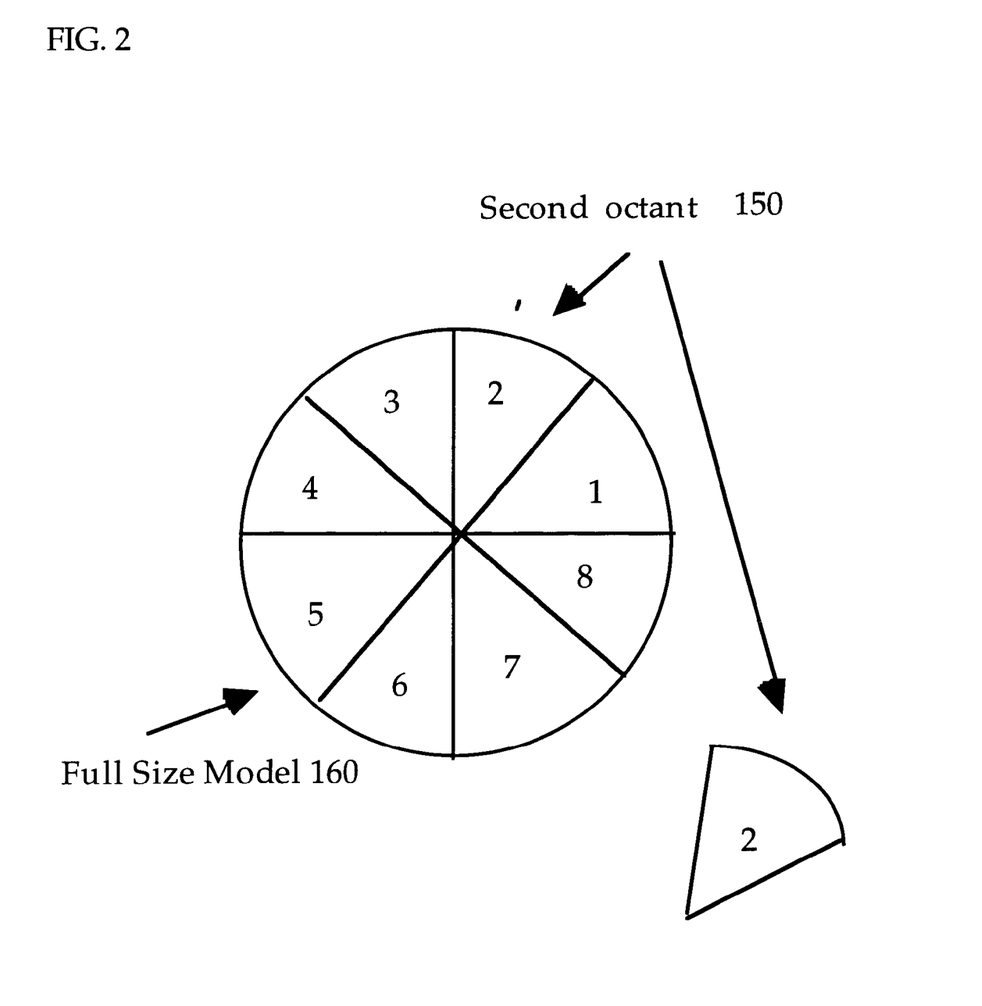
FIG. 2 depicts the creation of a segment model according to the present invention.

Turning to FIG. 2, using a circular fiducial for illustration purposes, a preferred embodiment of the invention generates a full resolution full size grey scale model of the fiducial, by creating a grey scale model of a first octant 150, of a circle by interpolating curvature at the periphery. Next, this grey scale model of the second octant 150 is reflected around the axes of symmetry of the circle to generate a full size model 160, of the circle.

Figure 4A:
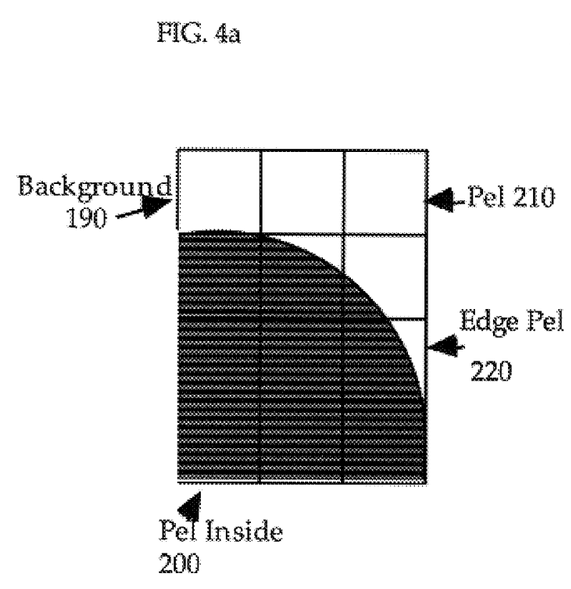
FIG. 4a depicts a segment of a dark circular fiducial on a white background.
Figure 4B:
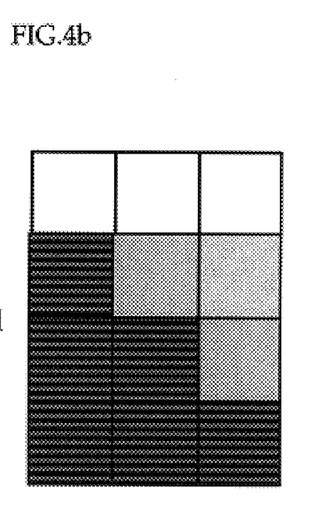
FIG. 4b depicts pel or pixel values assigned to the edge pels according to the method and apparatus of the present invention.

As shown in FIGS. 4*a* and 4*b*, a grey level model is used to represent any pixel that is on the edge of a curvilinear object instead of rounding up or down to a binary level. The grey level model can be either generated synthetically from mathematical formulas or created from pre-trained images of actual objects.

The decision to use a grey level model for an inherently binary object arises from the nature of the imaging system. In an image digitized from a camera, there is a small area of the camera's view of a symbol that is represented by each digitized pixel or pel. Each pel may be entirely inside the symbol, entirely outside the symbol or on the border between the symbol and the background. For example, in FIG. 4*a*, assume a dark fiducial 180, is to be located on a bright background 190. When a pel falls completely inside the fiducial, 200, the resulting pel brightness is minimized for that image. Similarly, when a pel falls completely outside the fiducial, 210, the pel brightness is maximized. However, when the pel is on the edge of the fiducial, 220, then the resulting pel value is somewhere between the minimum and maximum brightness values, depending on how much of the fiducial is within the pel.

By generating a model that tries to replicate this imaging process, it is possible to achieve a more reliable fiducial or symbol location. The value of the pel at any given edge point is determined by the proportion of the area of the pel taken up by the fiducial, applied to the range in brightness from the fiducial to the background as illustrated in FIG. 4*b*.

While it is possible to locate a curvilinear object using a model where the value for each pel on the edge is represented by calculating the area of the arc contained within each pel, as a practical matter, it would be unnecessarily complex and time consuming to actually calculate the area taken by the circle for each pel on the edge. According to the present invention, steps can be taken to approximate the area that take far less time.

For a circular fiducial, for purposes of illustration, only 1/8 of the circle edge pels' locations need to be calculated, because of the symmetry properties of a circle. As illustrated in FIG. 2, a second octant 150 or segment of a full model 160, can be generated. Then the representation of that one segment or octant can be reflected around the axis. As illustrated in FIG. 4, to create the grey scale values, foreground pixel values are assigned to those pixels located entirely within fiducial 180; background pixel values are assigned to those pixels located entirely outside tfiducial 180.

Pixel values for boundary pels of fiducial 180 can be approximated or interpolated by any of a number of means. A preferred embodiment of the present invention uses rectangles and triangles to interpolate. For circular symbols, as discussed above, it is only necessary to calculate the area of the edge pixels for 1/8 of the circle.

Figure 5:
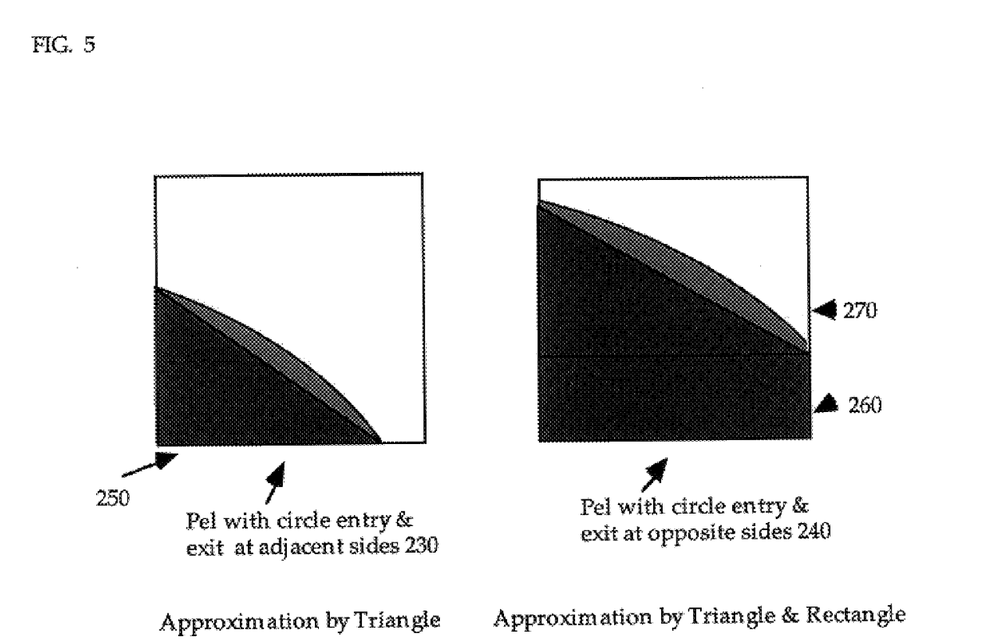
FIG. 5 shows two edge pels interpolated according to a preferred embodiment of the present invention.

Turning now to FIG. 5, choosing the top edge of the circle and proceeding clockwise, as shown, there are only two cases that need to be considered for a circular fiducial interpolation using triangle and rectangle substitution, given that the circle must enter the left edge of the pixel or pel and exit either the right edge or the bottom.

If the circle enters the left edge of the pel and exits the bottom of the pel 230, it can be approximated by a single triangle 250 comprising the pel boundaries, and the exit and the entry points.

If the circle enters the left edge of the pel and exits the right side 240, then it can be approximated by a rectangle 260 extending from the bottom of the pel to the point of exit on the right edge, and a triangle 270, drawn on top of the rectangle and having the pel's entry and exit points, as vertices.

Using simple formulas for finding the areas of triangles and rectangles, the area of the pixel occupied by the interior of the symbol can be computed and divided by the area of the pixel as a whole. For example, a triangle might approximate a boundary pel having only 25% of a part of the circle's boundary in it. This means that 75% of the boundary pel is background. A grey level that represents this can be selected according to the formula $$fg+(bg-fg) \times percentage.$$

Returning to FIG. 2, once approximation is complete for a segment or octant 150, the present invention creates a full size grey scale model by reflecting the octant or segment about the axes of symmetry of the circle or other curvilinear symbol. This can be accomplished by copying the pel values into other octants or segments and transposing coordinates as appropriate. For example, the first segment or octant found might be reflected around the main diagonal to form the first quadrant. Continuing reflections and transpositions from octant to octant are done as necessary to exploit symmetry and complete a full circle grey level model 160. It can be seen that copying and transposition of coordinates are simpler operations than some others that can be used to calculate the fill of a circle or other curvilinear object. Similar reflections and transpositions can be done for curvilinear symbols having differing geometries.

Figure 3:
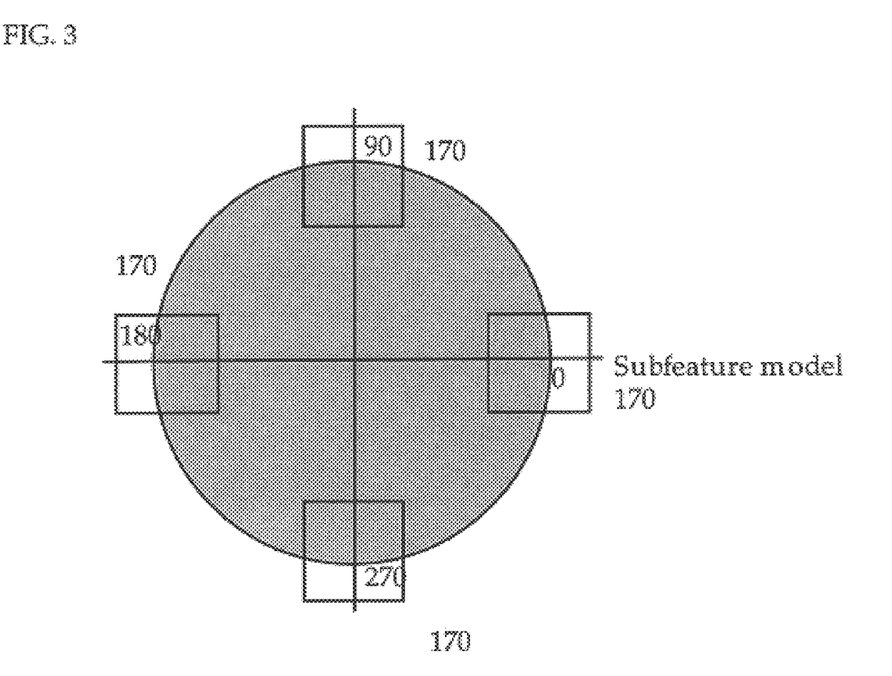
FIG. 3 illustrates the creation of full resolution submodels.

Turning now to FIG. 3, a partial resolution model (not shown) is created from the full size image and the depicted full resolution subfeature models 170, are created. In a preferred embodiment of the present invention, the reference or origin points in the subfeature models are offset so that a search conducted at runtime will return coordinates for locations in the digitized image that match the subfeature model in such a way as to make the final computation of the location of the curvilinear object simple. All of this is accomplished in the model generation and training phase to reduce processing steps and time in production or at runtime.

At runtime, a coarse location normalized correlation search is done, in the interests of speed and efficiency, in a preferred embodiment of the present invention using a reduced resolution full size model. In this preferred embodiment, the reduced resolution full size model is used as a template for a correlation search function of a machine vision system. A coarse location search, while usually not accurate to the pixel level, is fast. The coarse location results are used to define a region of interest to be searched using the subfeature models 170.

As shown in FIG. 3, full resolution subfeature models 170 for a circular fiducial taken from the model generated according to the method and apparatus of the present invention are created at 0, 90, 180 and 270 degrees, (although other intervals are possible) and for other curvilinear objects, at equidistant intervals around the symbol.

A preferred embodiment of the invention uses normalized correlation search functions provided in a commercially available machine vision system from Cognex corporation, but any of a number of other commercially available machine vision systems and search techniques could be used. While a preferred embodiment of the invention uses normalized correlation searching to minimize variations in image brightness and contrast, other embodiments of the invention could use absolute correlation searches, or relative correlation searches in appropriate vision processing and analysis applications. Similarly, rather than using correlation searches, contour finding, edge detection and template matching search techniques could be used by machine vision systems constructed in accordance with the method and apparatus of the present invention.

Once a coarse location has been found and a region of interest chosen, a search of the region of interest within the digitized image is done for each subfeature model and the corresponding x-y coordinates found are weighted.

Figure 7:
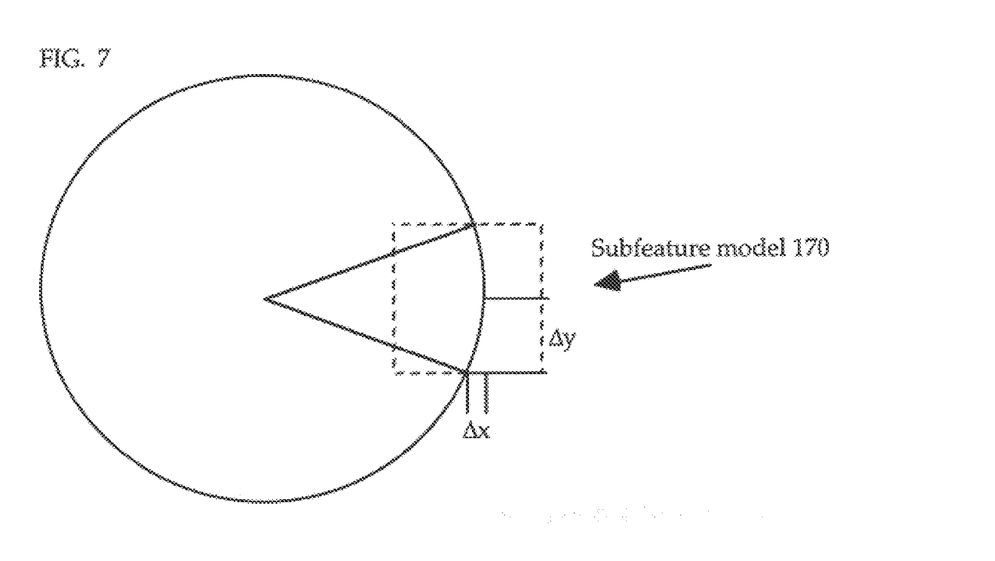
FIG. 7 depicts a method for assigning weights to coordinate axes.

Coordinate axis weighting according to the method and apparatus of the present invention is shown more fully in FIG. 7. FIG. 7 shows the coordinate axes Δy and Δx, of a subfeature model 170 created from the 0 degree position on the circumference of a full size circle model 160. These axes are assigned weighting values according to the likelihood that they will contribute usefully to the result.

As can be seen from the subfeature model 170 depicted in FIG. 7, there is not necessarily an equal amount of confidence for the information provided by each axis.

Figure 6:
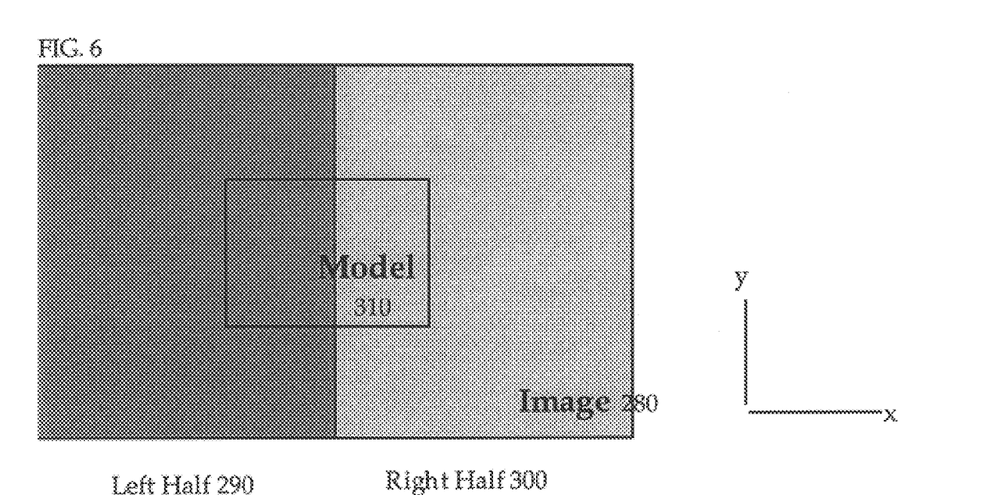
FIG. 6 illustrates a model in which the y axis of the model provides less information useful for finding the image than the x axis provides.

To illustrate further, turning to FIG. 6, if an image 280 is divided with the left half 290 as one grey value and the right half 300, as another a search model 310, can be trained that is a subset of the image about the center.

As can be seen from FIG. 6, any resulting search operation will have a solid x axis position for the model 310 and a highly variable y axis position because there are a large number of equally good y match positions.

Turning now to FIG. 3 it can be seen that this is also true for a circle, or curvilinear object. If a subfeature model 170 is to match at zero degrees, there will be much more confidence in the x position than in the y position. In this case, there is some confidence in the y position, because a best match position exists, but it is very close to other good matching positions along the curve. In a real image with video noise and real fiducials, the best y match position at zero degrees is even more muddied.

To account for this variance, the present invention weights the positions returned from search based on a calculated confidence level. A number of techniques can be envisioned for assigning weights or values to represent this confidence. This can include selecting weighting values based on the relative changes in curvature over the span of the subfeature model's perimeter.

In one embodiment, a weighting for a given coordinate axis is derived from the change in the coordinates for the other axis from the start of the curve to its end divided by the net change for both axes. This is merely representative of one way to calculate such coordinate axes weightings. A number of other ways could be devised by one skilled in the art.

In the illustration in FIG. 7, for example, the x-coordinate contribution is more highly weighted than the y-coordinate contribution, because the model contains little or no y-positional information or data. The higher value accorded the x coordinates allows the search to "lock in" better in the x direction, while the y position is highly variable.

As another example, it is also the case that the x coordinate positions for a subfeature model could be given arbitrary weightings, such as 90% for the x axis and 10% for the y, for one subfeature model, and perhaps the opposite values for another, to reflect the amount each is estimated to provide useful information about the actual location of the fiducial.

In a preferred embodiment of the present invention weighting values for circular fiducials derived from experimental tests resulted in confidence factors of 95% for the x coordinates and 5% for the y coordinates for the 0° and 180° submodels and 5% for the x coordinates and 95% for the y coordinates for the 90° and 270° submodels.

Figure 8:
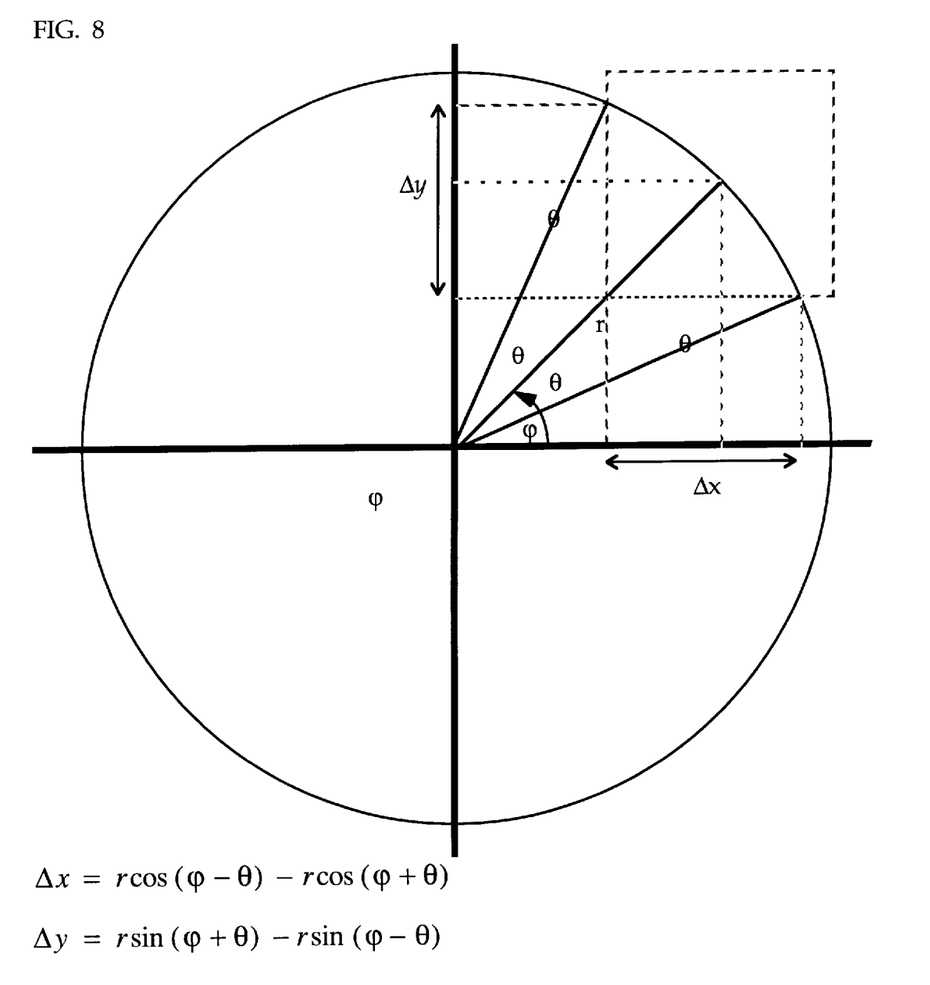
FIG. 8 illustrates coordinate axis weighting.

To derive a more general formula for the x and y scale factors, consider the situation where the subfeature model is centered at φ degrees, with a span of ±θ degrees. This is depicted in FIG. 8.

Using the trigonometric formulas for the sines and cosines of the sums of angles:

$$\sin(\theta+\phi)=\sin\theta\cos\phi+\cos\theta\sin\phi$$

$$\cos(\theta+\phi)=\cos\theta\cos\phi-\sin\theta\sin\phi$$

A preferred embodiment of the present invention then uses the following formulas for the scale factors:

$$\Delta x = r(\cos(-\theta)\cos\phi - \sin(-\theta)\sin\phi) - r(\cos\theta\cos\phi - \sin\theta\sin\phi)$$

$$\Delta y = r(\sin\theta\cos\phi + \cos\theta\sin\phi) - r(\sin(-\theta)\cos\phi + \cos(-\theta)\sin\phi)$$

$$\Delta x = r\cos\theta\cos\phi + r\sin\theta\sin\phi - r\cos\theta\cos\phi + r\sin\theta\sin\phi$$

$$\Delta y = r\sin\theta\cos\phi + r\cos\theta\sin\phi + r\sin\theta\cos\phi - r\cos\theta\sin\phi$$

$$\Delta x = 2r\sin\theta\sin\phi$$

$$\Delta y = 2r\sin\theta\cos\phi$$

$$xweight = \frac{\Delta y}{\Delta x + \Delta y} \qquad yweight = \frac{\Delta x}{\Delta x + \Delta y}$$

$$xweight = \frac{\sin\theta\cos\varphi}{\sin\theta\sin\varphi + \sin\theta\cos\varphi} \qquad yweight = \frac{\sin\theta\sin\varphi}{\sin\theta\sin\varphi + \sin\theta\cos\varphi}$$

To illustrate further, consider two special cases: one where φ is set to 45 degrees, and the other where it is set to 0 degrees. In the first case, everything should balance and the resulting scale factors should be ½ each. In the second case, the scale should be much larger than the x scale for a θ of about 20 degrees.

Since at 45 degrees sin θ is the same as cos θ, it is possible to substitute sin θ for all instances of cos θ. All terms become sin φ sin θ, and the resulting scale factors are ½.

However, at 0 degrees, the x scale factor becomes 0 and the y scale factor becomes 1, implying that there is no curvature in x at 0 degrees. In this case, the curvature in x when the angle is positive is offset by the same curvature in x when the angle is negative. In the example shown there is no net change in x coordinate at zero degrees for the full model because the curve starts and ends at the same x coordinate. This problem can be eliminated by only calculating the scale factor from the center of the model to one of the edges. This particular example using this symmetry relationship works when j is a multiple of 90 degrees.

Again, for purposes of illustration only, it can be seen that it is possible to recalculate the scale factors based on the symmetry argument:

$$\Delta x = r - r \cos\theta$$

$$\Delta y = r \sin\theta$$

$$xweight = \frac{r\sin\theta}{r\sin\theta + r - r\cos\theta} \quad yweight = \frac{r - r\cos\theta}{r\sin\theta + r - r\cos\theta}$$

$$xweight = \frac{\sin\theta}{\sin\theta + 1 - \cos\theta} \quad yweight = \frac{1 - \cos\theta}{\sin\theta + 1 - \cos\theta}$$

Assuming a span of 30 degrees for the model, this yields a θ value of 15 degrees. The resulting scale factors in this illustration will be 0.884 for x and 0.116 for y.

As can be seen, the coordinate axis weighting factors in a preferred embodiment of the present invention are somewhat arbitrary and many other variations could be devised. The principal objectives of any method are to weight each coordinate by its likelihood of contributing usefully to the final result; creating weights that are smooth, that is weights that do not produce large discontinuities; and assigning weights that are related to the information content in the x and y dimensions. It is desirable that the weights are also capable of being computed at the time the subfeature models are being trained or generated and can be applied at runtime.

Figure 9:
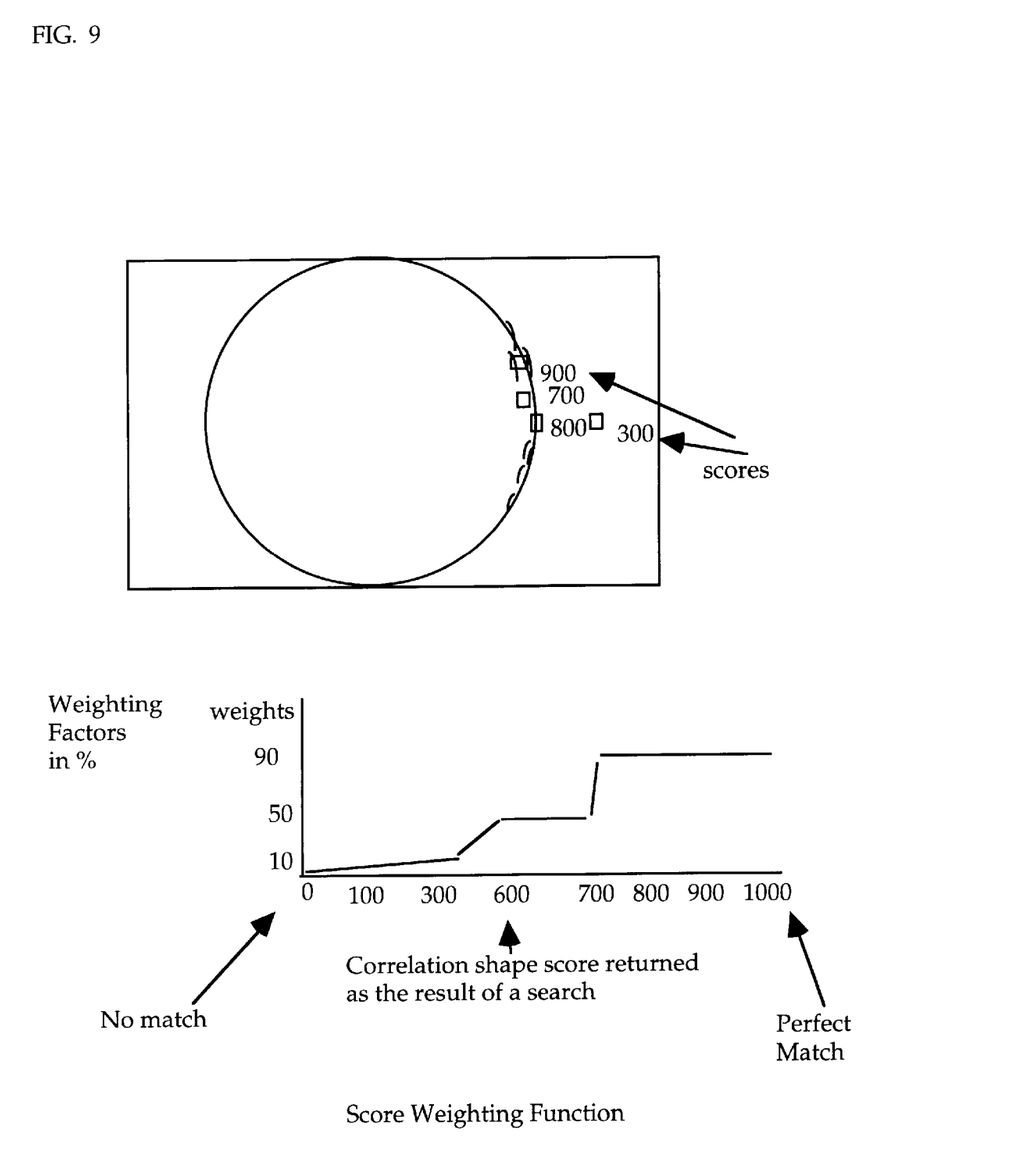
FIG. 9 depicts shape scores and score weighting.

In most searching operations, the search feature returns a score, illustrated in FIG. 9, that indicates how well the model matched or corresponded to the shape of a location found in the image. According to the method and apparatus of the present invention x,y coordinate positions found by a search using a subfeature model can also be weighted by this shape score. In one embodiment of the present invention each found position is multiplied by the score and then divided by the sum of the scores.

In a preferred embodiment of the present invention, the machine vision system is asked to find multiple results for each subfeature model. Scores that are below a specified minimum can be given zero weights while those within other ranges can be given varying weights according to their likelihood of being accurate. In FIG. 9, a set of scores returned by a machine vision system for a subfeature model are shown. In this example, the scores are arbitrarily given nonlinear weights. Scores above 700, for example, are all given high weights of 90. Scores below 300 are given low weights of 10. Scores that fall in between are weighted at around 50. While the x,y coordinate with the highest score may theoretically be the best match, it is possible that it may not be, in fact, the best match, and, as in the example shown, the point with the score of 900 is not the best match to a subfeature model, while the point with the score of 800 is better.

It is an aspect of the present invention that this method of score weighting can be used alone or in combination with the coordinate axis weighting assigned to the subfeature models.

Weighting becomes slightly more complicated when score weighting is combined with coordinate axes weighting. The combined weighting can be computed as follows:

C is a coefficient used to represent the coordinate axis weighting factor of a subfeature model, n; S is a coefficient used to represent the score weighting factor, and X is the number of coordinates being weighted. Then the formula:

$$\frac{\sum nCnSnXn}{\sum nCnSn}$$

can be used to combine the two weighting techniques.

In a preferred embodiment of the present invention the sum of the weighted values can thus be divided by the sum of the weights.

A preferred embodiment of the present invention can use any of several methods to calculate the position of the circle or curvilinear symbol based on the found positions corresponding to the subfeature models.

If positions in the digitized image corresponding to all subfeature models are found, these positions are averaged, in the case of a circle, to calculate the center of the circle.

If only 3 out of 4 subfeature models are found for a circle or ellipse, the location of two matching points on the same diameter are found, and these two are used to calculate a scale factor which is applied to the remaining subfeature model position. The remaining subfeature model position is then reflected or copied about the diameter, and the resulting positions are used to compute the location of the symbol.

In a preferred embodiment of the present invention a least squares regression based circle fitting technique can also be used to improve accuracy. In some instance, using least squares error techniques to compute the best circle fir can eliminate the need for special cases based on fewer than the full number of subfeature models found. Least squares error techniques for finding a best fit of a circle are known to those skilled in the art.

A preferred embodiment of the invention also provides for setting tolerance thresholds for deviation in distance from an ideal subfeature model location. Tolerance thresholds can be set at training time or at runtime. In a preferred embodiment, these thresholds are set at training time as distance parameters based on an ideal, or expected subfeature model.

Figure 10:
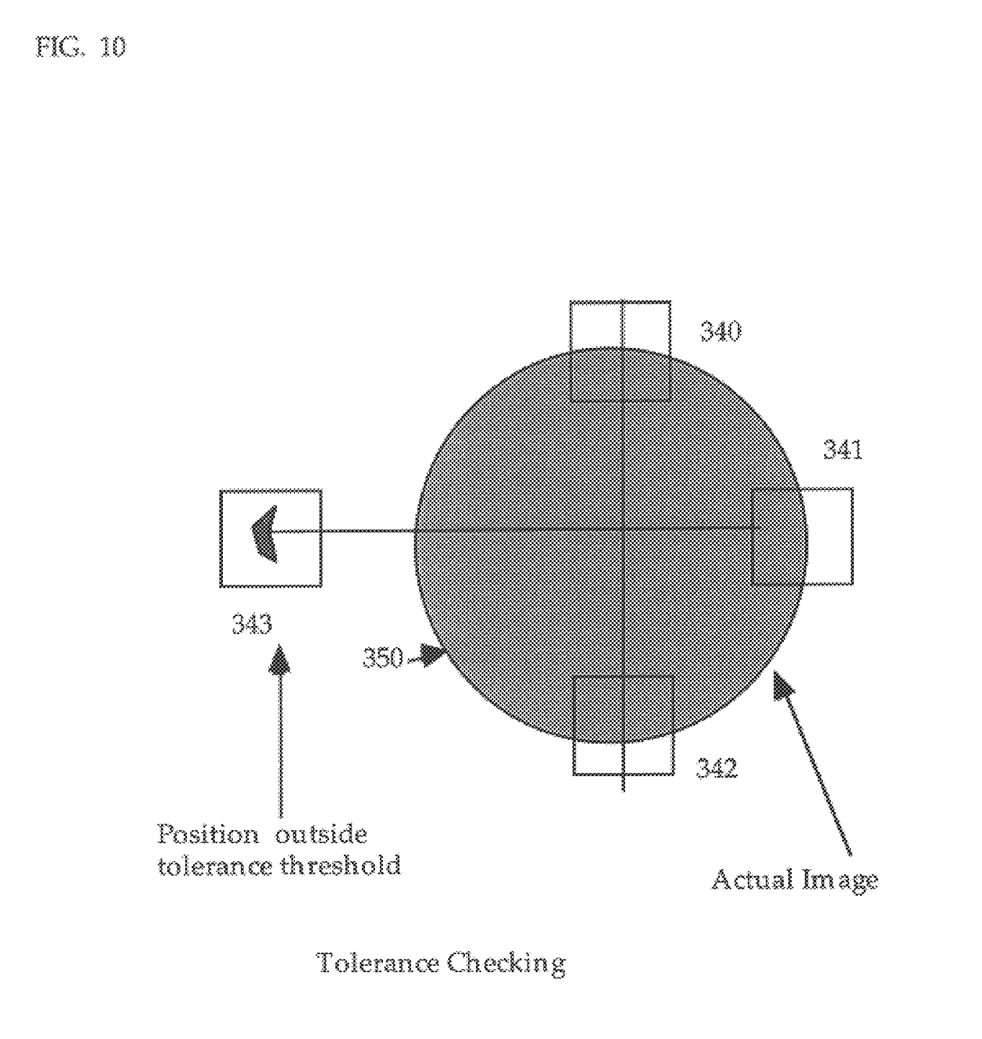
FIG. 10 illustrates the application of tolerance thresholds.

Turning to FIG. 10, it can be seen that a search might report four points, 340, 341, 342, 343 found that correspond to four subfeature models for a circle. However, as shown in FIG. 10, the point 343 found for the subfeature model at 270 degrees is a significant distance away from the actual location on the periphery of the actual image (shown here by the shaded circle, 350.)

FIG. 10 thus illustrates the situation in which one of the locations found by the machine vision system is outside tolerable bounds for deviations from an idealized curvilinear symbol.

To prevent such spurious results from affecting the accuracy of the overall location attempt, the invention computes a threshold for deviations in the distance from the edge of the symbol to ideal subfeature model locations. When a point 343 is found as in FIG. 10, which is outside this tolerance threshold, the invention discards that point and computes the position of the symbol using the x,y coordinate positions that remain. As aspect of this feature of the invention is that is can be used to address the situation where one of the fiducials has been smeared or is otherwise difficult to locate.

The values to be assigned to the tolerance thresholds can be decided either arbitrarily or empirically, and can also be expressed in a number of ways. In a preferred embodiment of the invention the thresholds can be expressed as percentages of the expected length of a radius.

In one embodiment of the invention searches are done for the object requesting multiple results for each subfeature model. The invention computes the location of the symbol using data returned for points corresponding to the best scores corresponding to each subfeature models. In the case where a best matching point falls outside the tolerance threshold, the present invention discards that position and selects the position having the next best score, and recomputes the weights and fit to compute the location again. The steps of discarding and selection are repeated until a position for the subfeature model within the specified tolerances is found.

Those skilled in the art will appreciate that the embodiments described above are illustrative only and that other systems in the spirit of the teachings herein fall within the scope of the invention. Thus, for example, it will be appreciated that methods and apparatus other than that described above for interpolation, weighting and setting tolerance thresholds can be used. Likewise, the use of interpolation and weighting approaches other than those described above fall within the spirit and scope of the invention. Moreover, it will be appreciated that the method and apparatus described herein can be used to identify curvilinear patterns other than circles or ellipses, and could also be used to locate, for example, toothed gears or other curved objects having symmetrical aspects.

Similarly, systems constructed in accord with the invention have applicability outside the field of machine production of printed circuit boards. Thus, for example, they can be used to locate curvilinear objects in printed materials, in general purpose images, and in positioning parts for assembly or inspection. Likewise, systems constructed in accord with the invention can be used to locate colored curvilinear objects for which grey scale interpretations can be created or converted.

These and other such uses, as well as modifications, additions and deletions to the techniques described herein may fall within the scope of the invention.

What is claimed is:

1. An apparatus for locating a curvilinear symbol comprising:
   a. means for generating a grey scale model of a segment of an idealized curvilinear symbol by interpolating curvature at the periphery by assigning foreground pixel values to those pixels located entirely within said grey scale model of said segment of said idealized curvilinear symbol, assigning background pixel values to those pixels located entirely outside said grey scale model of said segment of said idealized curvilinear symbol, and approximately pixel values for boundary pixels of said grey scale model of said segment of said idealized curvilinear symbol by selecting a number of points n, along an arc of said idealized curvilinear symbol that is smaller than the total number of points in said arc, connecting said points n, by straight lines to create an angular feature in each pixel boundary, computing the area of each such angular feature, and computing a grey scale level for each boundary pixel by scaling the grey value by the percentage of said pixel occupied by said angular feature;
   b. means for generating a full size model by reflecting said grey scale model of said segment of an idealized curvilinear symbol around the axes of symmetry of said idealized curvilinear symbol;
   c. means for searching a digitized image for the location of shapes corresponding to said full size model; and
   d. means for generating subfeature models from said full size model.

2. An apparatus for locating a curvilinear symbol comprising:
   a. means for generating a grey scale model of a segment of an idealized curvilinear symbol by interpolating curvature at the periphery by assigning foreground pixel values to those pixels located entirely within said grey scale model of said segment of said idealized curvilinear symbol, assigning background pixel values to those pixels located entirely outside said grey scale model of said segment of said idealized curvilinear symbol, and approximating pixel values for boundary pixels of said grey scale model of said segment of said idealized curvilinear symbol by substituting triangles and rectangles for the area occupied by a boundary pixel containing an arc of said curvilinear feature, such that a proportional rectangle and a proportioned triangle represent a boundary pixel having entry and exit point points at opposite sides of said pixel and a proportional triangle represents a boundary pixel having entry and exit points on adjacent sides of said pixel, computing the area of said triangles and rectangles, computing the percentage of said boundary pixel by occupied by said area and assigning a grey value to said pixel corresponding to said percentage;
   b. means for generating a full size model by reflecting said grey scale model of said segment of an idealized curvilinear symbol around the axes of symmetry of said idealized curvilinear symbol;
   c. means for searching a digitized image for the location of shapes corresponding to said full size model; and
   d. means for generating subfeature models from said full size model.

3. An apparatus for locating a curvilinear symbol comprising:
   a. means for generating a grey scale model of a segment of an idealized curvilinear symbol by interpolating curvature at the periphery by assigning foreground pixel values to those pixels located entirely within said grey scale model of said segment of said idealized curvilinear symbol, assigning background pixel values to those pixels located entirely outside said grey scale model of said segment of said idealized curvilinear symbol, and approximately pixel values for boundary pixels of said grey scale model of said segment of said idealized curvilinear symbol by selecting a boundary pixel containing an arc of said idealized curvilinear symbol, locating entry and exit points of said arc in said boundary pixel, computing substituted shapes for said boundary pixel such that: entry and exit points extending from opposite sides of said boundary pixel are represented by rectangles and triangles, whereby said exit points serve as vertices of a rectangle and a triangle tangent to each other;

entry and exit points extending from adjacent sides of said boundary pixel are represented by triangles having a vertex at said entry point and at said exit point, computing the area of said triangles and rectangles, and computing the proportion of said boundary pixel occupied by said area and assigning a grey value to said boundary pixel corresponding to said proportion;
   b. means for generating a full size model by reflecting said grey scale model of said segment of an idealized curvilinear symbol around the axes of symmetry of said idealized curvilinear symbol;
   c. means for searching a digitized image for the location of shapes corresponding to said full size model; and
   d. means for generating subfeature models from said full size model.

4. The apparatus of any of claims 1, 2 or 3 wherein the means for generating a subfeature model further comprises:

a. means for searching a digitized image for the location of shapes corresponding to said subfeature model;
b. means for returning x,y coordinates of locations found in said digitized image which correspond to said subfeature model;
c. means for assigning weighting values to said returned x,y coordinates corresponding to the likelihood that each coordinate will contribute usefully to the search, is capable of being computed at the time subfeature models are generated and minimized discontinuities by using the following formula:

$$\Delta x = r(\cos(-\theta)\cos\phi - \sin(-\theta)\sin\phi) - r(\cos\theta\cos\phi - \sin\theta\sin\phi)$$

$$\Delta y = r(\sin\theta\cos\phi + \cos\theta\sin\phi) - r(\sin(-\theta)\cos\phi + \cos(-\theta)\sin\phi)$$

$$\Delta x = r\cos\theta\cos\phi + r\sin\theta\sin\phi - r\cos\theta\cos\phi + r\sin\theta\sin\phi$$

$$\Delta y = r\sin\theta\cos\phi + r\cos\theta\sin\phi + r\sin\theta\cos\phi - r\cos\theta\sin\phi$$

$$\Delta x = 2r\sin\theta\sin\phi$$

$$\Delta y = 2r\sin\theta\cos\phi$$

$$xweight = \frac{\Delta y}{\Delta x + \Delta y} \qquad yweight = \frac{\Delta x}{\Delta x + \Delta y}$$

$$xweight = \frac{\sin\theta\cos\varphi}{\sin\theta\sin\varphi + \sin\theta\cos\varphi} \qquad yweight = \frac{\sin\theta\sin\varphi}{\sin\theta\sin\varphi + \sin\theta\cos\varphi}$$

5. The method of any of claims 1, 2 or 3 wherein the step of generating a subfeature model further comprises:
   a. searching a digitized image for the location of shapes corresponding to said subfeature model;
   b. returning x,y coordinates of locations found in said digitized image which correspond to said subfeature model;
   c. assigning weighting values to said returned x,y coordinates corresponding to the likelihood that each coordinate will contribute usefully to the search, is capable of being computed at the time subfeature models are generated and minimizes discontinuities by using the following formula:

$$\Delta x = r(\cos(-\theta)\cos\phi - \sin(-\theta)\sin\phi) - r(\cos\theta\cos\phi - \sin\theta\sin\phi)$$

$$\Delta y = r(\sin\theta\cos\phi + \cos\theta\sin\phi) - r(\sin(-\theta)\cos\phi + \cos(-\theta)\sin\phi)$$

$$\Delta x = r\cos\theta\cos\phi + r\sin\theta\sin\phi - r\cos\theta\cos\phi + r\sin\theta\sin\phi$$

$$\Delta y = r\sin\theta\cos\phi + r\cos\theta\sin\phi + r\sin\theta\cos\phi - r\cos\theta\sin\phi$$

$$\Delta x = 2r\sin\theta\sin\phi$$

$$\Delta y = 2r\sin\theta\cos\phi$$

$$xweight = \frac{\Delta y}{\Delta x + \Delta y} \qquad yweight = \frac{\Delta x}{\Delta x + \Delta y}$$

$$xweight = \frac{\sin\theta\cos\varphi}{\sin\theta\sin\varphi + \sin\theta\cos\varphi} \qquad yweight = \frac{\sin\theta\sin\varphi}{\sin\theta\sin\varphi + \sin\theta\cos\varphi}$$

6. An apparatus for locating a curvilinear symbol, comprising:
   a. means for generating a grey scale model of an arc of an idealized curvilinear symbol;
   b. means for interpolating curvature at the periphery of said arc;
   c. means for reflecting said grey scale model of said arc around the axes of symmetry of said idealized curvilinear symbol to generate a full size model of said idealized curvilinear symbol;
   d. means for generating a partial resolution model of said full size model;
   e. means for generating a full resolution subfeature model from said full size model;
   f. means for assigning coordinate axes weighting to each axis of each subfeature model;
   g. means for defining a tolerance threshold for deviations from an idealized curvilinear symbol;
   h. means for searching said digitized image using said partial resolution model to find a coarse location of a corresponding shape;
   i. means for defining a region of interest within said digitized image using x,y coordinates of said coarse location;
   j. means for searching said region of interest for the location of shapes corresponding to said subfeature model;
   k. means for returning x,y coordinates for the locations of shapes corresponding to said subfeature model;
   l. means for returning scores indicating the correlation between said shapes found and said subfeature model;
   m. means for assigning axes weighting values to each axis of x,y coordinates returned for locations corresponding to said subfeature model;
   n. means for assigning score weighting values for scores returned;
   o; means for summing the axis weighting values;
   p. means for summing the score weighting values;
   q. means for dividing the sum of the weighting values by said sum of the weights to produce weighted positions corresponding to said subfeature model;
   r. means for discarding positions outside said tolerance thresholds;
   s. means for computing the location of said curvilinear symbol from remaining weighted positions.

7. The apparatus of claim 6 further comprising means for using least squares error to determine fit.

8. The apparatus of claim 6 for locating circular and elliptical curvilinear symbols further comprising:
   a. means for computing the location of at least two x,y coordinate positions corresponding to two subfeature models opposite each other;
   b. means for deriving a scale factor to be applied to a third subfeature model position;
   c. means for reflecting said third subfeature model position about the diameter, using the computed scale factor.

9. A method for locating a curvilinear symbol comprising the steps of:
   a. generate a grey scale model of a segment of an idealized curvilinear symbol by interpolating curvature at the periphery by assigning foreground pixel values to those pixels located entirely within said grey scale model of said segment of said idealized curvilinear symbol, assigning background pixel values to those pixels located entirely outside said grey scale model of said segment of said idealized curvilinear symbol, and approximating pixel values for boundary pixels of said grey scale model of said segment of said idealized curvilinear symbol by selecting a number of points, n, along an arc of said idealized curvilinear symbol that is smaller than the total number of points in said arc, connecting said points n, by straight lines to create an angular feature in each pixel boundary, computing the area of each such angular feature, and computing a grey scale level for each boundary pixel by scaling the grey value by the percentage of said pixel occupied by said angular feature;

b. generating a full size model by reflecting said grey scale model of said segment of an idealized curvilinear symbol around the axes of symmetry of said idealized curvilinear symbol;

c. searching a digitized image for the location of shapes corresponding to said full size model; and d. generating subfeature models from said full size model.

10. A method for locating a curvilinear symbol comprising the steps of:

a. generating a grey scale model of a segment of an idealized curvilinear symbol by interpolating curvature at the periphery by assigning foreground pixel values to those pixels located entirely within said grey scale model of said segment of said idealized curvilinear symbol, assigning background pixel values to those pixels located entirely outside said grey scale model of said segment of said idealized curvilinear symbol, and approximately pixel values for boundary pixels of said grey scale model of said segment of said idealized curvilinear symbol by substituting triangles and rectangles for the area occupied by a boundary pixel containing an arc of said curvilinear feature, such that a proportioned rectangle and a proportioned triangle represent a boundary pixel having entry and exit point points at opposite sides of said pixel and a proportioned triangle represents a boundary pixel having entry and exit points on adjacent sides of said pixel, computing the area of said triangles and rectangles, computing the percentage of said boundary pixel by occupied by said area and assigning a grey value to said pixel corresponding to said percentage;

b. generating a full size model by reflecting said grey scale model of said segment of an idealized curvilinear symbol around the axes of symmetry of said idealized curvilinear symbol;

c. searching a digitized image for the location of shapes corresponding to said full size model; and d. generating subfeature models from said full size model.

11. A method for locating a curvilinear symbol comprising the steps of:

a. generating a grey scale model of a segment of an idealized curvilinear symbol by interpolating curvature at the periphery by assigning foreground pixel values to those pixels located entirely within said grey scale model of said segment of said idealized curvilinear symbol, assigning background pixel values to those pixels located entirely outside said grey scale model of said segment of said idealized curvilinear symbol, and approximately pixel values for boundary pixels of said grey scale model of said segment of said idealized curvilinear symbol by selecting a boundary pixel containing an arc of said idealized curvilinear symbol, locating entry and exit points of said arc in said boundary pixel, computing substitute shapes for said boundary pixel such that;

entry and exit points extending from opposite sides of said boundary pixel are represented by rectangles and triangles, whereby said exit points serve as vertices of a rectangle and a triangle tangent to each other;

entry and exit points extending from adjacent sides of said boundary pixel are represented by triangles having a vertex at said entry point and at said exit point, computing the area of said triangles and rectangles, and computing the proportion of said boundary pixel occupied by said area and assigning a grey value to said boundary pixel corresponding to said proportion;

b. generating a full size model by reflecting said grey scale model of said segment of an idealized curvilinear symbol around the axes of symmetry of said idealized curvilinear symbol;

c. searching a digitized image for the location of shapes corresponding to said full size model; and d. generating subfeature models from said full size model.

12. A method for locating a curvilinear symbol, comprising:

a. generating a grey scale model of an arc of an idealized curvilinear symbol;

b. interpolating curvature at the periphery of said arc;

c. reflecting said grey scale model of said arc around the axes of symmetry of said idealized curvilinear symbol to generate a full size model of said idealized curvilinear symbol;

d. generating a partial resolution model of said full size model;

e. generating a full resolution subfeature model from said full size model;

f. assigning coordinate axes weighting to each axis of each subfeature model;

g. defining a tolerance threshold for deviations from an idealized curvilinear symbol;

h. searching said digitized image using said partial resolution model to find a coarse location of a corresponding shape;

i. defining a region of interest within said digitized image using x,y coordinates of said coarse location;

j. searching said region of interest for the location of shapes corresponding to said subfeature model;

k. returning x,y coordinates for the locations of shapes corresponding to said subfeature model l. returning scores indicating the correlation between said shapes found and said subfeature model;

m. assigning axes weighting values to each axis of x,y coordinates returned for locations corresponding to said subfeature model;

n. assigning score weighting values for scores returned;

o; summing the axis weighting values;

p. summing the score weighting values;

q. dividing the sum or the weighting values by said sum of the weights to produce weighted positions corresponding to said subfeature model;

r. discarding positions outside said tolerance thresholds;

s. computing the location of said curvilinear symbol from remaining weighted positions.

13. The method of claim 12 further comprising using least squares error to determine fit.

14. The method of claim 12 for locating circular and elliptical curvilinear symbols further comprising:

a. computing the location of at least two x,y coordinate positions corresponding to two subfeature models opposite each other;

b. deriving a scale factor to be applied to a third subfeature model position;

c. reflecting said third subfeature model position about the diameter, using the computed scale factor.

* * * * *